United States Patent [19]

Masujima et al.

[11] Patent Number: 5,730,573
[45] Date of Patent: Mar. 24, 1998

[54] CLEAN TRANSFER METHOD AND APPARATUS THEREFOR

[75] Inventors: Sho Masujima, Tokyo; Eisaku Miyauchi, Akita-ken; Toshihiko Miyajima, Akita-ken; Hideaki Watanabe, Akita-ken, all of Japan

[73] Assignee: TDK Corporation, Japan

[21] Appl. No.: 391,609

[22] Filed: Feb. 21, 1995

[30] Foreign Application Priority Data

Feb. 22, 1994 [JP] Japan .................. 6-047734

[51] Int. Cl.$^6$ .................. B65G 49/07
[52] U.S. Cl. .................. 414/217; 414/939; 414/940
[58] Field of Search .................. 414/217, 937, 414/939, 940

[56] References Cited

U.S. PATENT DOCUMENTS

| | | | |
|---|---|---|---|
| 4,534,389 | 8/1985 | Tullis | 414/217 X |
| 4,674,939 | 6/1987 | Maney et al. | 414/940 X |
| 4,687,542 | 8/1987 | Davis et al. | |
| 4,746,256 | 5/1988 | Boyle et al. | 414/940 X |
| 4,804,086 | 2/1989 | Grohrock | 414/940 X |
| 4,842,680 | 6/1989 | Davis et al. | |
| 4,943,457 | 7/1990 | Davis et al. | |
| 4,966,519 | 10/1990 | Davis et al. | |
| 5,137,063 | 8/1992 | Foster et al. | |
| 5,169,272 | 12/1992 | Bonora et al. | 414/217 |
| 5,378,107 | 1/1995 | Vierny et al. | 414/217 X |
| 5,391,035 | 2/1995 | Krueger | 414/217 |
| 5,433,574 | 7/1995 | Kawano et al. | 414/940 X |

FOREIGN PATENT DOCUMENTS

| | | | |
|---|---|---|---|
| 1064335 | 3/1989 | Japan | 414/940 |
| 5055344 | 3/1993 | Japan | 414/940 |
| 6048508 | 2/1994 | Japan | 414/939 |
| 6048509 | 2/1994 | Japan | 414/940 |

*Primary Examiner*—James W. Keenan
*Attorney, Agent, or Firm*—Lerner, David, Littenberg, Krumholz & Mentlik

[57] ABSTRACT

A clean transfer method and an apparatus therefor capable of facilitating storage and transfer of transferred objects by a vacuum clean box and realizing transfer of the objects to various processing units other than a vacuum unit. A vacuum clean box and a clean unit are airtightly connected to each other. The vacuum clean box includes a first shutter acting also as a lid and arranged so as to airtightly close a first opening of the box. The clean unit is provided with a second opening selectively closed by a second shutter. Airtight connection between the vacuum clean box and the clean unit is carried out while keeping the first and second openings closed by the first and second shutters, respectively, to thereby form a closed space therebetween which the first and second shutters face. Then, the closed space is evacuated to a vacuum, followed by opening of only the first shutter. Subsequently, a clean atmosphere which is substantially identical with a clean atmosphere in the clean unit is formed in the closed space and the second shutter is opened to introduce the first and second shutters into the clean unit.

16 Claims, 8 Drawing Sheets

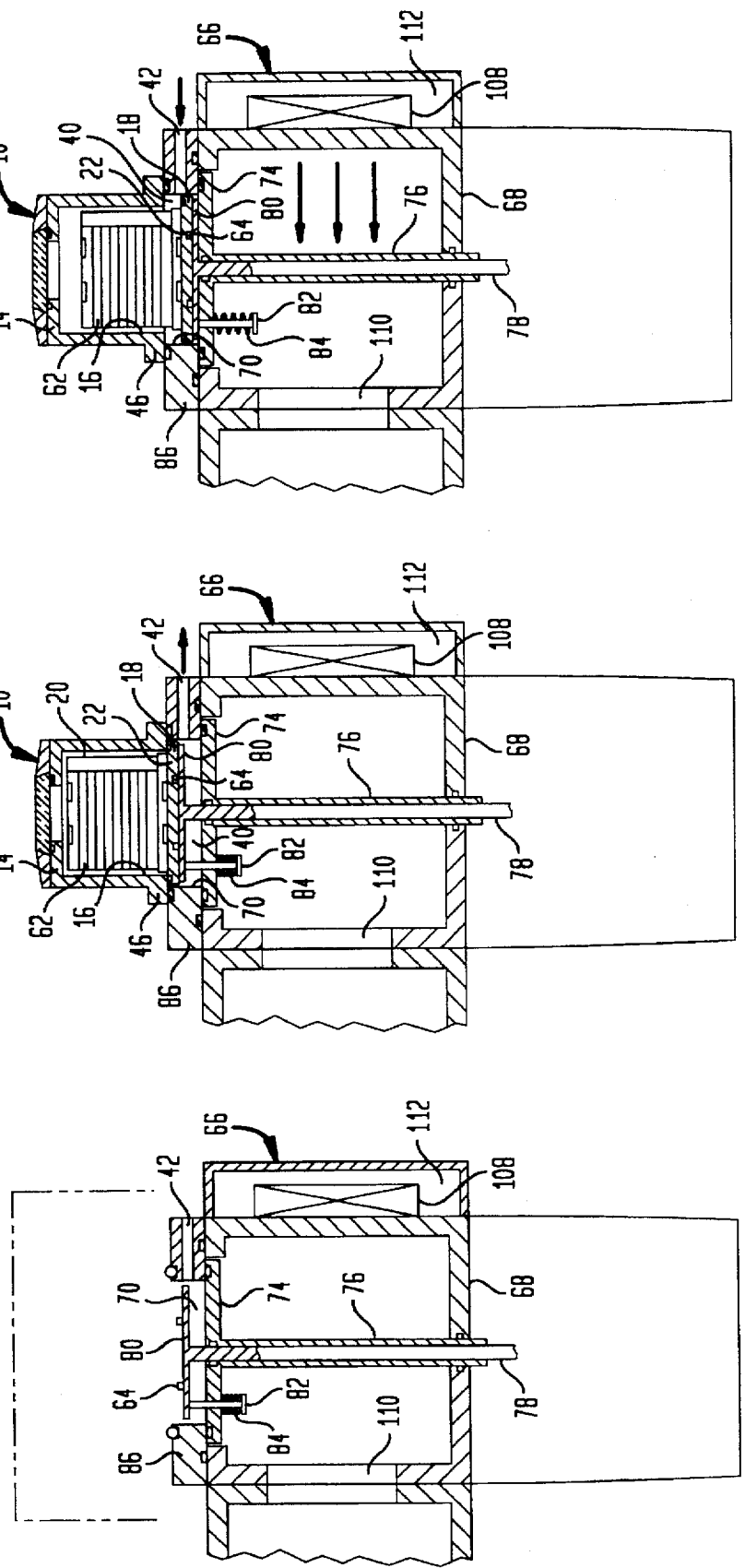

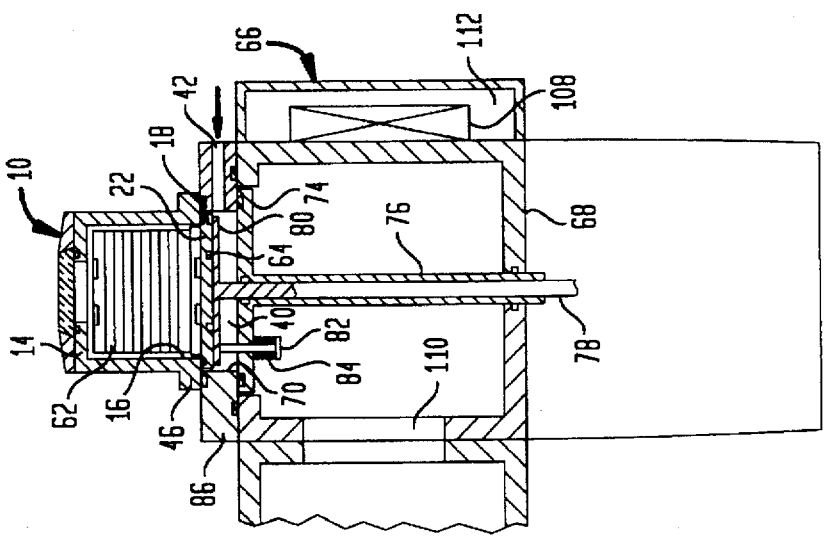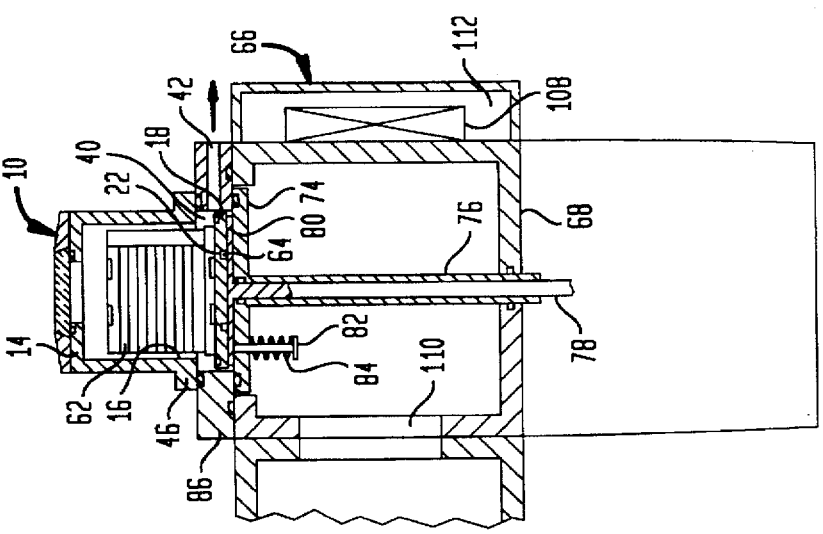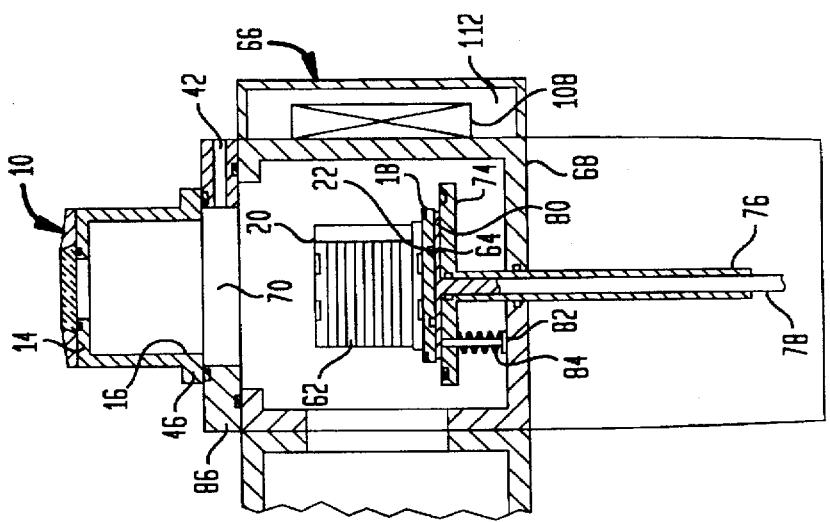

CLEAN TRANSFER METHOD AND APPARATUS THEREFOR

BACKGROUND OF THE INVENTION

This invention relates to a clean transfer method and an apparatus therefor, and more particularly to a clean transfer method for transferring objects to be transferred (hereinafter referred to as "transferred objects") required for processing and/or assembling a product associated with a semiconductor, an optical disc or the like while keeping an operating environment clean and free of any contamination, and an apparatus therefor.

The assignee proposed transfer of an optical mini-disc or a product associated with a semiconductor such as a semiconductor wafer or the like between vacuum units by means of a vacuum clean box for the transportation during the manufacturing, as disclosed in U.S. patent application Ser. No. 08/176,197 filed on Jan. 3, 1994.

FIGS. 8A to 9B show a procedure for transfer of transferred objects between vacuum units by means of a vacuum clean box as described above, wherein reference numeral 10 designates a vacuum clean box and 12 is a vacuum unit. The vacuum clean box 10 includes a box body 14 provided at one or a lower end thereof with a first opening 16 and a first shutter 18 acting also as a lid and arranged for selectively airtightly closing the opening 16. The vacuum clean box 10 is constructed so as to be kept a vacuum therein due to closing of the box body 14 by the first shutter 18, to thereby eliminate arrangement of any vacuum evacuation means and transfer means in the vacuum clean box 10. The first shutter 18 is mounted on an front or upper surface thereof with a holder 20 for supporting transferred objects such as optical mini-discs, products associated with a semiconductor or the like thereon. Also, the first shutter 18 is formed on a rear or lower surface thereof with a plurality of aligning recesses 22, in which positioning pins 24 provided on a side of the vacuum unit 12 which will be described hereinafter are detachably fitted, respectively.

The vacuum unit 12 is attached to a vacuum processing apparatus in order to transfer the transferred objects such as optical mini-discs, products associated with a semiconductor or the like by means of the vacuum clean box 10. For this purpose, the vacuum unit 12 includes a vacuum evacuation means, as well as an airtight vessel 26 provided with a second opening 28, a second shutter 30 mounted on a distal end of an actuation rod 32, a spacer block 34 fixed on an upper surface of the second shutter 30 and a plurality of the above-described positioning pins 24 fixed on the spacer block 34 so as to upwardly extend from an upper surface thereof. The shutter actuation rod 32 is constructed so as to be extendably actuated in order to vertically move the shutter 30. The positioning pins 24 are detachably fitted in the aligning recesses 22 of the first shutter 18 on the side of the vacuum clean box 10. The second opening 28 is defined by a connection block 38 fixed on the airtight vessel 26.

In the conventional clean transfer apparatus of FIGS. 8A to 9B thus constructed, when the vacuum clean box 10 is not placed on the vacuum unit 12 as shown in FIG. 8A, the second opening 28 of the vacuum unit 12 is closed by the second shutter 30 and an outer surface of the second shutter 30 is exposed to an ambient atmosphere. When the transferred objects in the vacuum clean box 10 is to be moved to the vacuum unit 12, the vacuum clean box 10 is placed on the opening 28 of the vacuum unit 12, as shown in FIG. 8B. Concurrently, the positioning pins 24 are fittedly inserted in the aligning recesses 22 of the vacuum clean box 10. This results in the vacuum clean box 10 being connected to the vacuum unit 12, so that the connection block 38, first shutter 18 and second shutter 30 cooperate with each other to define an intermediate area 40 acting as a closed space. The intermediate area 40 is initially exposed to an atmospheric pressure and then evacuated through a vacuum evacuation path 42 by means of a vacuum evacuation means (not shown) on the side of the vacuum unit 12, so that a high vacuum is formed therein.

Such evacuation of the intermediate area 40 to a vacuum causes a difference in pressure between an outside of the shutter 18 of the vacuum clean box 10 and its inside to be eliminated; so that contraction of the actuation rod 32 of the vacuum unit 12 and downward movement of the shutter 30 and spacer block 34 cause the shutter 18 and holder 20 on which the transferred objects are held to be concurrently downwardly moved together with the second shutter 30 and spacer block 34 as shown in FIG. 9A, because a weight of the shutter 18 and that of the transferred objects held on the holder 22 act thereon. This results in a space in the vacuum unit 12 communicating with a space in the vacuum clean box 10, so that the shutter 18 and transferred objects may be introduced into the airtight vessel 26.

When the vacuum clean box 10 connected to the vacuum unit 12 as described above is to be released from the vacuum clean box 10, the actuation rod 32 is expanded to cause the intermediate area 40 formed by cooperation of the connection block 38, first shutter 18 and second shutter 30 with each other to be airtight. Then, the intermediate area 40 is returned to an atmospheric pressure, so that the atmospheric pressure in the intermediate area 40 acts on a lower surface of the first shutter 18, resulting in the box body 14 and first shutter 18 being sealedly joined to each other. This permits the first shutter 18 to be smoothly released or disengaged from the positioning pins 24. Then, the box body 14 and first shutter 18 are integrally joined to each other in an airtight manner, to thereby provide the vacuum clean box 10 having the transferred objects received therein, which is then transferred to any desired location.

As noted from the above, in the conventional clean transfer apparatus, the first shutter 18 of the vacuum clean box 10 and the second shutter 30 of the vacuum unit 12 are concurrently operated. Unfortunately, such concurrent operation fails to permit a unit operated under an atmospheric pressure to be substituted for the vacuum unit 12. More particularly, even when the intermediate area 40 which has been rendered airtight is evacuated to a vacuum, an air atmosphere enters the intermediate area 40 when concurrent opening of the shutters 18 and 30 is started, leading to a failure in opening of the shutter 18. Thus, the conventional clean transfer apparatus shown in FIGS. 8A to 9B is restricted to only transfer of the transferred objects between the vacuum units by means of the vacuum clean box 10. Unfortunately, manufacturing of a semiconductor or the like is restricted to a substantially narrowed range, so that a range of vacuum clean transfer applied to the manufacturing is restricted correspondingly.

Also, the construction of the conventional clean transfer apparatus wherein the first shutter 18 of the vacuum clean box 10 and the second shutter 30 of the vacuum unit 12 are concurrently operated causes a difference between a pressure in the vacuum clean box 10 and that in the vacuum unit 12 to be substantially increased, when the vacuum clean box 10 is kept non-operated for a long period of time, to thereby be decreased in vacuum. This leads to a problem of causing dust to be scattered in the vacuum clean box 10 and vacuum unit 12 when both communicate with each other.

SUMMARY OF THE INVENTION

The present invention has been made in view of the foregoing disadvantage of the prior art.

Accordingly, it is an object of the present invention to provide a clean transfer method which is capable of facilitating storage and transfer of transferred objects by means of a vacuum clean box of which an inner space to be kept at a vacuum is minimized while eliminating arrangement of any vacuum evacuation means and transfer means.

It is another object of the present invention to provide a clean transfer method which is capable of transferring transferred objects to various processing units as well as a vacuum unit.

It is a further object of the present invention to provide a clean transfer method which is capable of being applied to manufacturing of a semiconductor or the like in various ways.

It is still another object of the present invention to provide a clean transfer apparatus which is capable of facilitating storage and transfer of transferred objects by means of a vacuum clean box of which an inner space to be kept at a vacuum is minimized while eliminating arrangement of any vacuum evacuation means and transfer means.

It is yet another object of the present invention to provide a clean transfer apparatus which is capable of transferring transferred objects to various processing units as well as a vacuum unit.

It is a still further object of the present invention to provide a clean transfer apparatus which is capable of being applied to manufacturing of a semiconductor or the like in various ways.

In accordance with one aspect of the present invention, a clean transfer method is provided. The clean transfer method comprises the step of airtightly connecting a vacuum clean box and a clean unit to each other. The vacuum clean box includes a box body provided with a first opening and a first shutter acting also as a lid and arranged so as to airtightly close the first opening of the box body and is free of any vacuum evacuation means and transfer means. Also, the vacuum clean box is constructed so as to provide airtightness sufficient to keep an interior thereof at a vacuum when the first opening is closed by the first shutter. The clean unit is provided with a second opening selectively closed by a second shutter. The airtight connection between the vacuum clean box and the clean unit is carried out while keeping the first and second openings closed by the first and second shutters, respectively, to thereby form a closed space therebetween which the first and second shutters face. The method also comprises the steps of evacuating the closed space to a vacuum, followed by opening of only the first shutter, forming a clean atmosphere in the closed space defined by the vacuum clean box and second shutter which is substantially identical with a clean atmosphere formed in the clean unit, and opening the second shutter to introduce the first and second shutters into the clean unit.

In accordance with another aspect of the present invention, a clean transfer apparatus is provided. The clean transfer apparatus comprises a vacuum clean box including a box body provided with a first opening and a first shutter acting also as a lid and arranged so as to airtightly close the first opening. The vacuum clean box is constructed so as to provide airtightness sufficient to keep an interior thereof at a vacuum when the first opening is closed by the first shutter. The vacuum clean box is free of any vacuum evacuation means and transfer means. The clean transfer apparatus also includes a clean unit including a carrier detachably engaged with the first shutter, a second shutter and a driving means for driving the carrier and second shutter and provided with a second opening which is opened and closed by the second shutter. The vacuum clean box and clean unit cooperates with each other to form a closed space therebetween which the first and second shutters face when the vacuum clean box and clean unit are connected to each other. The first shutter is rendered open by driving the carrier through the driving means while keeping the second opening closed by the second shutter.

In a preferred embodiment of the present invention, the second shutter is urged toward the carrier so that an interval between the second shutter and the carrier is reduced.

In a preferred embodiment of the present invention, the carrier is provided thereon with positioning pins detachably fitted in the first shutter.

In a preferred embodiment of the present invention, the first shutter is mounted thereon with a holder for supporting transferred objects at a predetermined posture.

In a preferred embodiment of the present invention, the clean unit includes a filter and a gas circulating means for circulating clean gas in said closed space.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein:

FIGS. 3A to 3C each are a schematic view showing a first half of operation of the clean transfer apparatus of FIG. 1;

FIGS. 4A to 4C each are a schematic view showing a second half of operation of the clean transfer apparatus of FIG. 1;

DETAILED DESCRIPTION OF THE PREFERRED EMBODIMENTS

Figure 1:
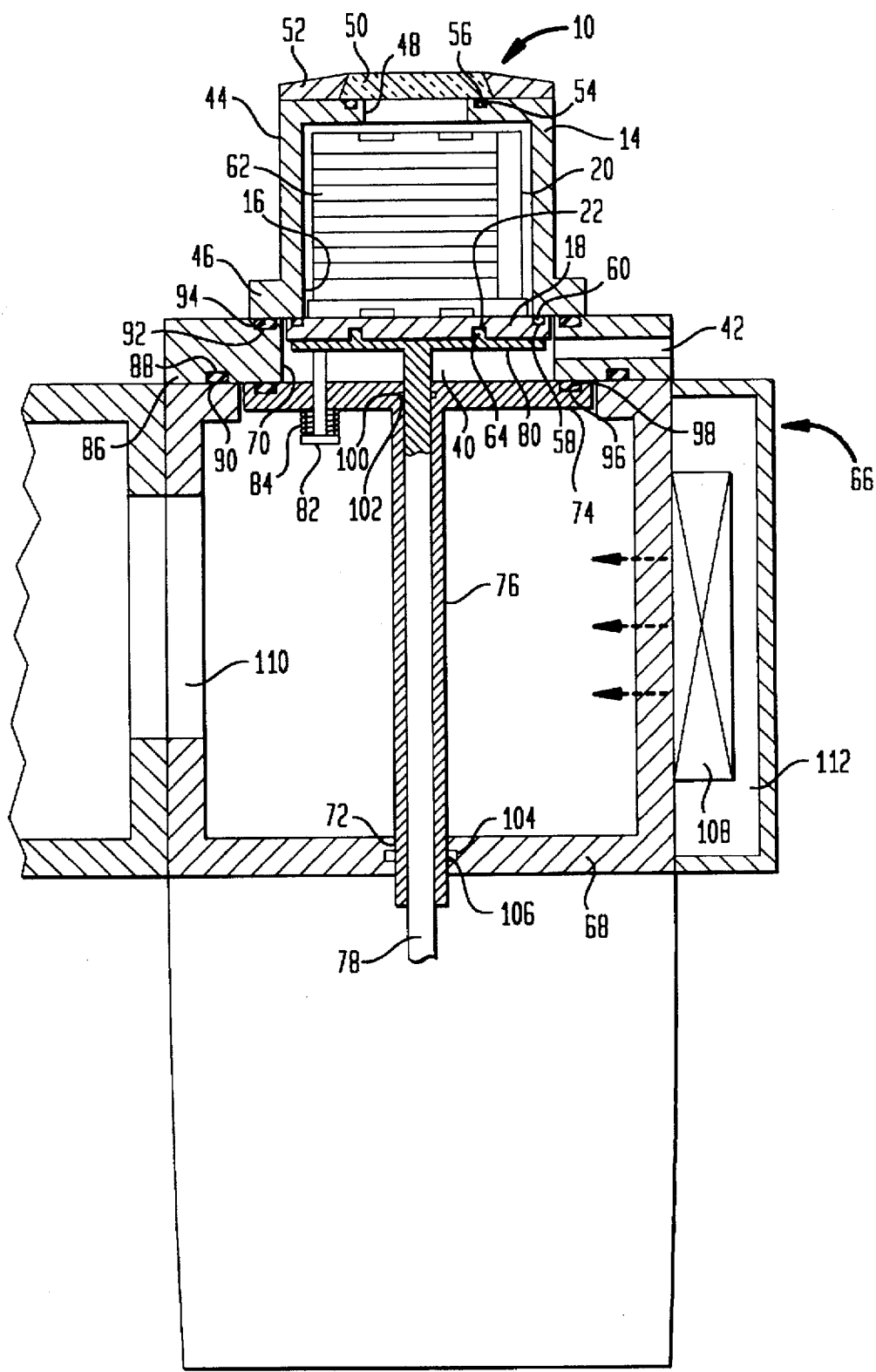
FIG. 1 is a front elevation view in section showing a first embodiment of a clean transfer apparatus according to the present invention.

Now, the present invention will be described hereinafter with reference to FIGS. 1 to 7.

Referring first to FIGS. 1 to 4, a first embodiment of a clean transfer apparatus according to the present invention is illustrated. A clean transfer apparatus of the illustrated embodiment includes a vacuum clean box 10 including a box body 14 provided on one end thereof with a first opening 16 and a first shutter 18 acting also as a lid for airtightly closing the first opening 16. The vacuum clean box 10 is constructed so as to provide airtightness sufficient to keep interior thereof at a vacuum when the first shutter 18 closes the first opening 16 of the box body 14 and be free of any vacuum evacuation means and transfer means. The box body 14 includes a box-like member 44 provided on one end or a lower end thereof with the first opening 16 and formed at the one end thereof with an outwardly extending flange 46 so as to surround the first opening 16. The box-like member 44 is formed at the other end or an upper end thereof with an aperture 48. The box body 14 also includes a transparent member 50 for sealedly closing the aperture 48 of the box-like member 44 and a fixing member 52 for fixing the transparent member 50 on the box-like member 44. The transparent member 50 provided on the aperture 48 acts as a sight window, through which an interior of the vacuum clean box 10 is externally observed. The box-like member 44 is formed at a portion thereof against which the transparent member 50 is abutted with a groove 54, in which an O-ring 56 is fitted to ensure airtightness between the box-like member 44 and the transparent member 50. The fixing member 52 is securely mounted on the box-like member 44 using a suitable fixing means such as screws or the like.

The first shutter 18 is formed at a portion thereof against which the box body 14 is abutted with a groove 58, in which an O-ring 60 is fitted so as to ensure airtightness between the first shutter 18 and the box body 14. The first shutter 18 is mounted on an upper or front surface thereof with a holder 20 for carrying transferred objects or semiconductor wafers 62 thereon. The holder 20 is constructed so as to hold a plurality of the semiconductor wafers 62 therein in a manner to be spaced from each other at intervals and in a horizontal manner. The first shutter 18 is formed on a lower or rear surface thereof with a plurality of aligning recesses 22, in which positioning pins 64 arranged on a side of a clean unit 66 are detachably fitted. The pins 64 will be described hereinafter.

The clean transfer apparatus of the illustrated embodiment also includes the clean unit 66 acting as a processing unit for carrying out various kinds of processing and constructed so as to be integrally connected to the vacuum clean box 10. The clean unit 66 includes an airtight vessel 68 formed at an upper end thereof with a second opening 70 and at a lower or bottom end thereof with a through-hole 72, a second shutter 74 integrally mounted or fixed on a distal or upper end of a hollow rod 76 arranged in a manner to vertically extend via the through-hole 72 of the airtight vessel 68 into the airtight vessel 68 and be moved in a vertical direction, an operation rod 78 slidably inserted through the hollow rod 76, a carrier 80 integrally mounted or fixed on a distal or upper end of the operation rod 78, and a plurality of the positioning pins 64 fixedly mounted on the carrier 80 so as to upwardly project therefrom.

The carrier 80 is securely mounted on a lower surface thereof with a spring mounting member 82 in a manner to extend through the second shutter 74. The spring mounting member 82 has a compression spring 84 mounted on a portion thereof between a head of the member 82 and a lower surface of the second shutter 74. The compression spring 84 acts to urge the second shutter 74 toward the carrier 80.

The operation rod 78 is vertically actuated by any suitable driving means (not shown) such as a hydraulic cylinder or the like. The positioning pins 64 are releasably fitted in the aligning recesses 22 of the first shutter 18 of the vacuum clean box 10.

In the illustrated embodiment, the second opening 70 is formed in a connection block 86 fixed on the airtight vessel 68. The connection block 86 is formed with a thickness substantially larger than a sum of a thickness of the first shutter 18 and that of the carrier 80. The connection block 86 is formed on a surface thereof contacted with the airtight vessel 68 with a groove 88, in which an O-ring 90 is arranged to ensure airtightness between the connection block 86 and the airtight vessel 68. Likewise, the connection block 86 is formed on a surface thereof contacted with the flange 46 of the vacuum clean box 10 with a groove 92, in which an O-ring 94 is fitted to ensure airtightness between the connection block 86 and the flange 46. The second shutter 74 is formed on a surface thereof contacted with the connection block 86 with a groove 96, in which an O-ring 98 is arranged to ensure airtight connection between the second shutter 74 and the connection block 86.

The second shutter 74 is formed on an inner periphery thereof contiguous to an inner periphery of the hollow rod 76 with a groove 100, in which an O-ring 102 is fitted to ensure airtightness between the operation rod 78 and the second shutter 74. Also, the through-hole 72 of the bottom of the airtight vessel 68 is formed on a surface thereof with a groove 104, in which an O-ring 106 is fitted to ensure airtightness or dust sealing between the through-hole 72 and the hollow rod 76.

Figure 2:
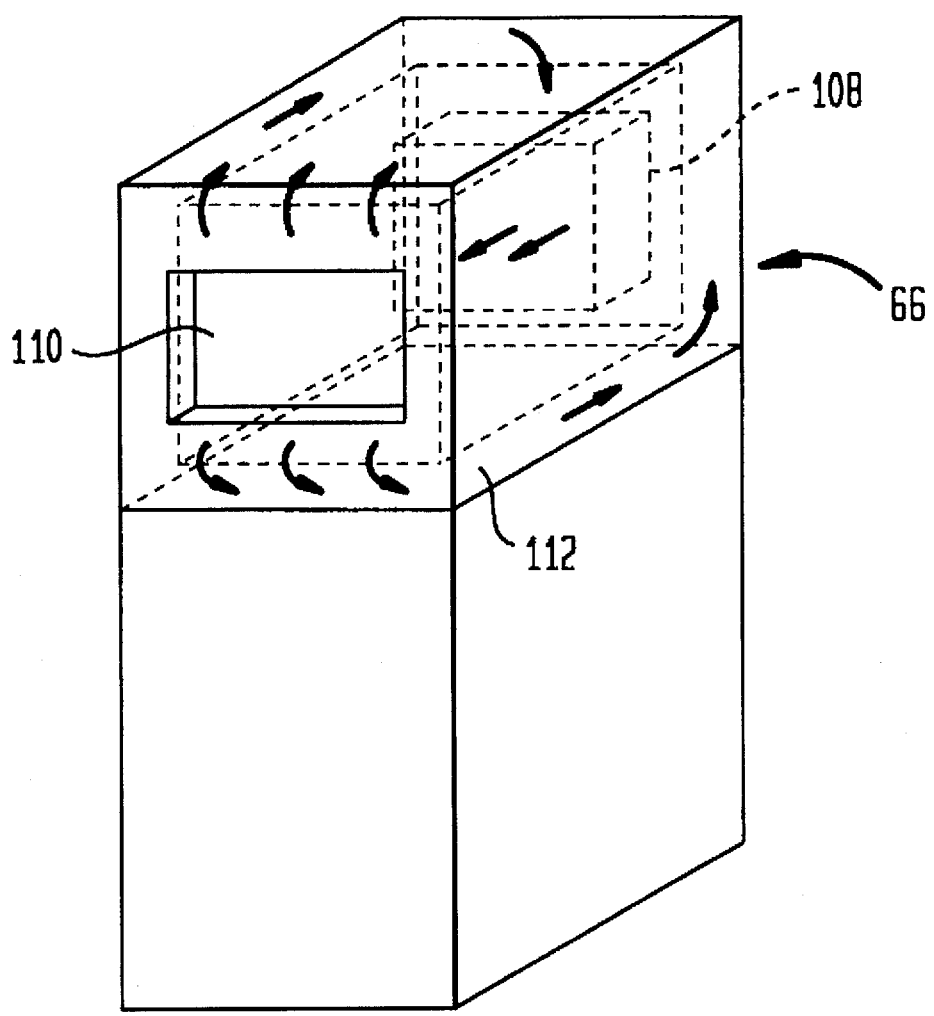
FIG. 2 is a perspective view showing a clean system of the self-circulation type incorporated in the clean transfer apparatus of FIG. 1.

The clean unit 66 thus constructed has a clean system of the self-circulation type incorporated therein. More particularly, the clean system, as shown in FIG. 2, includes a fan filter 108 which may comprise a combination of a filter for removal of dust and a fan acting as a gas circulating means. The fan filter 108 acts to circulate gas such as air, nitrogen or the like free of any suspended dust in a closed space defined in the airtight vessel 68 and the like as indicated at arrows in FIG. 2. Connection of the vacuum clean box 10 to the clean unit 66 causes an intermediate area 40 to be defined in the form of an airtight closed space by cooperation of an inner peripheral surface of the connection block 86 defining the second opening 70 therein, a lower surface of each of the first shutter 18 and flange 46 and an upper surface of the second shutter 74. The connection block 86 is formed with an evacuation path 42 so as to laterally extend therethrough, through which the intermediate area 40 is evacuated to a vacuum. The clean unit 66 further includes a vacuum evacuation means such as a vacuum pump or the like which functions to carry out vacuum evacuation of the intermediate area 40 through the evacuation path 42. Also, the clean unit 66 includes a transfer means for transferring semiconductor wafers 62 introduced into the airtight vessel 68 to each of various processing sections.

Reference numeral 110 designates a communication opening formed through a side wall of the airtight vessel 68, which is adapted to be connected to a like communication opening of a like airtight vessel arranged adjacent to the vessel 68. 112 is a clean circulation duct for returning gas to the fan filter 108.

Now, the manner of operation of the clean transfer apparatus of the first embodiment constructed as described above will be described hereinafter.

Prior to connection to the clean unit 66, the vacuum clean box 10 is previously evacuated to a vacuum by means of a separate vacuum changer and sealedly closed by the first shutter 18 for transportation. Such previous evacuation of the vacuum clean box 10 is preferably carried out to a degree of vacuum as low as 0.1 Torr or less in order to substantially reduce dust therein. A pressure difference between a high vacuum thus formed in the vacuum clean box 10 and a pressure of an ambient atmosphere causes the first shutter 18 to be urged toward the first opening 16, to thereby airtightly seal the first opening 16, resulting in safely transferring the vacuum clean box 10 having the semiconductor wafers 62 received therein while effectively preventing movement of the first shutter 18.

Before the vacuum clean box 10 is carried on the clean unit 66 as shown in FIG. 3A, the second opening 70 of the clean unit 66 is closed by the second shutter 74, which is kept exposed on the upper surface thereof to an ambient atmosphere.

Connection between the vacuum clean box 10 and the clean unit 66 is carried out by abuttedly placing the flange 46 of the vacuum clean box 10 on the connection block 86 of the clean unit 66 defining the second opening 70 while keeping the first shutter 18 of the vacuum clean box 10 downwardly facing as shown in FIGS. 1 and 3B. Concurrently, the positioning pins 64 of the carrier 80 are fitted in the aligning recesses 22 of the first shutter 18. The flange 46 is held on the connection block 86 by means of a holding fitment (not shown). Also, the second shutter 74 of the clean unit 66 is upwardly urged by the compression spring 84 because the operation rod 78 is kept at a raised position, to thereby be abutted against the inner peripheral surface of the connection block 86 defining the second opening 70, resulting in airtightly sealing the opening 70.

The above-described connection between the vacuum clean box 10 and the clean unit 66 results in the intermediate area 40 defined by the inner peripheral surface of the connection block 86, the lower surface of each of the first shutter 18 and flange 46 and the upper surface of the second shutter 74 being rendered airtightly closed. More particularly, the first shutter 18 and second shutter 74 are permitted to face the intermediate area 40. The intermediate area 40 thus rendered airtight is initially exposed to an ambient atmosphere. Then, it is evacuated to a vacuum as low as, for example, 0.1 Torr or less through the evacuation path 42 using the vacuum evacuation means arranged on the side of the clean unit 66. This causes dust which is possibly present on the carrier 80, the second shutter 74 and the like exposed to an ambient atmosphere to be concurrently outwardly discharged.

Evacuation of the intermediate area 40 to a vacuum causes a difference in pressure between an outside of the first shutter 18 and an inside thereof to be eliminated. Thus, when the operation rod 78 of the clean unit 66 is slightly lowered to downwardly move the carrier 80, a weight of each of the first shutter 18, holder 20 and semiconductor wafers 62 causes the first shutter 18 and semiconductor wafers 62 to be concurrently downwardly moved, resulting in a space in the vacuum clean box 10 and the intermediate area 40 communicating with each other. In this instance, the second shutter 74 keeps the second opening 70 of the shutter 74 airtightly sealed irrespective of such slight lowering of the carrier 80, because the second shutter 74 is upwardly urged by the compression spring 84.

Vacuum evacuation of the intermediate area 40 in FIG. 3B may be partially carried out so as to permit a degree of vacuum in the intermediate area 40 to approximate that in the vacuum clean box 10 in view of a period of time for which the vacuum clean box has been left non-operated, so that opening of the first shutter 18 while keeping a pressure difference between the interior of the vacuum clean box 10 and the intermediate area 40 reduced effectively prevents dust from being floated or scattered. Then, the intermediate area 40 and vacuum clean box 10 are permitted to communicate with each other, followed by evacuation of the intermediate area to a high vacuum as low as, for example, 0.1 Torr or less.

Then, in a state shown in FIG. 3C, clean gas is introduced from the clean unit 66 through the evacuation path 42 into the intermediate area 40 and vacuum clean box 10, resulting in a pressure on the upper surface of the second shutter 74 and that on the lower surface thereof being rendered substantially equal to each other, followed by substantial downward movement of the operation rod 78 and hollow rod 76. This causes the second shutter 74 to be substantially open, leading to communication between the clean unit 66 and the vacuum clean box 10, so that a weight of each of the first shutter 18, holder 20 and semiconductor wafers 62 held on the holder permits the first shutter 18 to be introduced into the clean unit 66 together with the carrier 80 while being placed on the carrier 80, as shown in FIG. 4A. Then, the semiconductor wafers 62 are removed from the holder 20 and then subjected to required processing, for example, in an air atmosphere.

When the semiconductor wafers 62 thus processed are returned to the holder 20, the operation rod 78 and the hollow rod 76 associated with the operation rod 78 are upwardly moved to cover the second opening 70 with the second shutter 74 while keeping the first shutter 18 open. Then, the intermediate area 40 and vacuum clean box 10 are evacuated through the evacuation path 42 to a degree of vacuum as low as, for example, 0.1 Torr or less sufficient to substantially remove suspended dust.

Subsequently, the operation rod 78 and the carrier 80 integral with the rod 78 are upwardly moved to close the first shutter 18, to thereby introduce the same atmosphere as that in the clean unit 66 through the evacuation path 42 into the intermediate area 40 kept airtight. This results in an atmospheric pressure in the intermediate area 40 forcing the lower surface of the first shutter 18 of the vacuum clean box 10 to permit the box body 14 and first shutter 18 to be airtightly integrated with the each other, so that the first shutter 18 may be smoothly released from the positioning pins 64 of the carrier 80. Thus, the vacuum clean box 10 having the semiconductor wafers 62 received therein which is constituted by the box body 14 and first shutter 18 thus integrated with each other is then transferred to any desired position.

Thus, the clean transfer apparatus of the first embodiment constructed as described above exhibits significant advantages.

First, when operation of the first shutter 18 for operating the first opening 16 of the vacuum clean box 10 and operation of the second shutter 74 for operating the second opening 70 of the clean unit 66 are executed at different timings, the vacuum clean box 10 may be used for transfer of the transferred objects or semiconductors 62 between vacuum units, as well as for transfer of the transferred objects from a vacuum unit such as a sputtering unit, a dry etching unit, a CVD unit or the like to the clean unit 66 such as an exposure unit, an oxidation unit, a diffusion unit, an inspection unit or the like for carrying out any desired processing under an atmospheric pressure or from the clean unit 66 to the vacuum unit. Also, it may be used for transfer of the transferred objects between the clean units. Thus, the clean transfer apparatus of the illustrated embodiment can be directed to a variety of applications and permits processing steps and/or works without requiring vacuum conditions to be carried out in a clean environment under an atmospheric pressure, leading to cost savings.

Also, the clean unit 66 has the self-circulation type clean system for circulating clean gas free of suspended dust in a closed space incorporated therein. The self-circulation type clean system is constructed so as to exclude operators from a working or operation space and includes the filter for keeping the operation space clean, thus, it will be noted that it requires only a clean space for operation.

Further, the intermediate area 40 formed due to connection of the vacuum clean box 10 to the clean unit 66 is subject to vacuum evacuation prior to transfer of the transferred objects. The vacuum evacuation permits dust suspended and/or deposited in the intermediate area 40 to be concurrently removed therefrom. Thus, the clean transfer apparatus can be operated even under the conditions that the second opening 70 of the clean unit 66 and the second shutter 74 are exposed to a common industrial atmosphere.

A degree of vacuum in the vacuum clean box 10 is often possibly deteriorated due to non-operation of the box 10 for a long period of time. However, evacuation of the intermediate area 40 formed due to connection between the clean unit 66 and the vacuum clean box 10 to a level approximating a degree of vacuum in the vacuum clean box 10 eliminates a pressure difference between the vacuum clean box 10 and the intermediate area 40, to thereby prevent scattering of dust due to the pressure difference owing to opening of the first shutter 18.

As described above, in the clean transfer apparatus of the illustrated embodiment, the second shutter 74 is integrally mounted or fixed on the distal end of the hollow rod 76 upwardly extending through the bottom of the airtight vessel 68 and the carrier 80 is fixed or integrally mounted on the distal end of the operation rod 78 slidably inserted into the hollow rod 76. Also, the compression spring 84 is arranged between the lower surface of the second shutter 74 and the head of the spring mounting member 82 mounted on the lower surface of the carrier 80 so as to extend through the second shutter 74, to thereby urge the second shutter 74 toward the carrier 80. Such construction permits the first shutter 18 and second shutter 74 to be operated at different timings by using, in common, a single driving source used for vertically driving the operation rod 78. Thus, the illustrated embodiment is significantly simplified in structure.

In the illustrated embodiment, the clean unit 66 is adapted to carry out processing under an atmospheric pressure. Alternatively, a vacuum unit may be substituted for the clean unit 66. In this instance, the step of introducing gas into the intermediate area 40 in FIG. 3C is eliminated.

Figure 5:
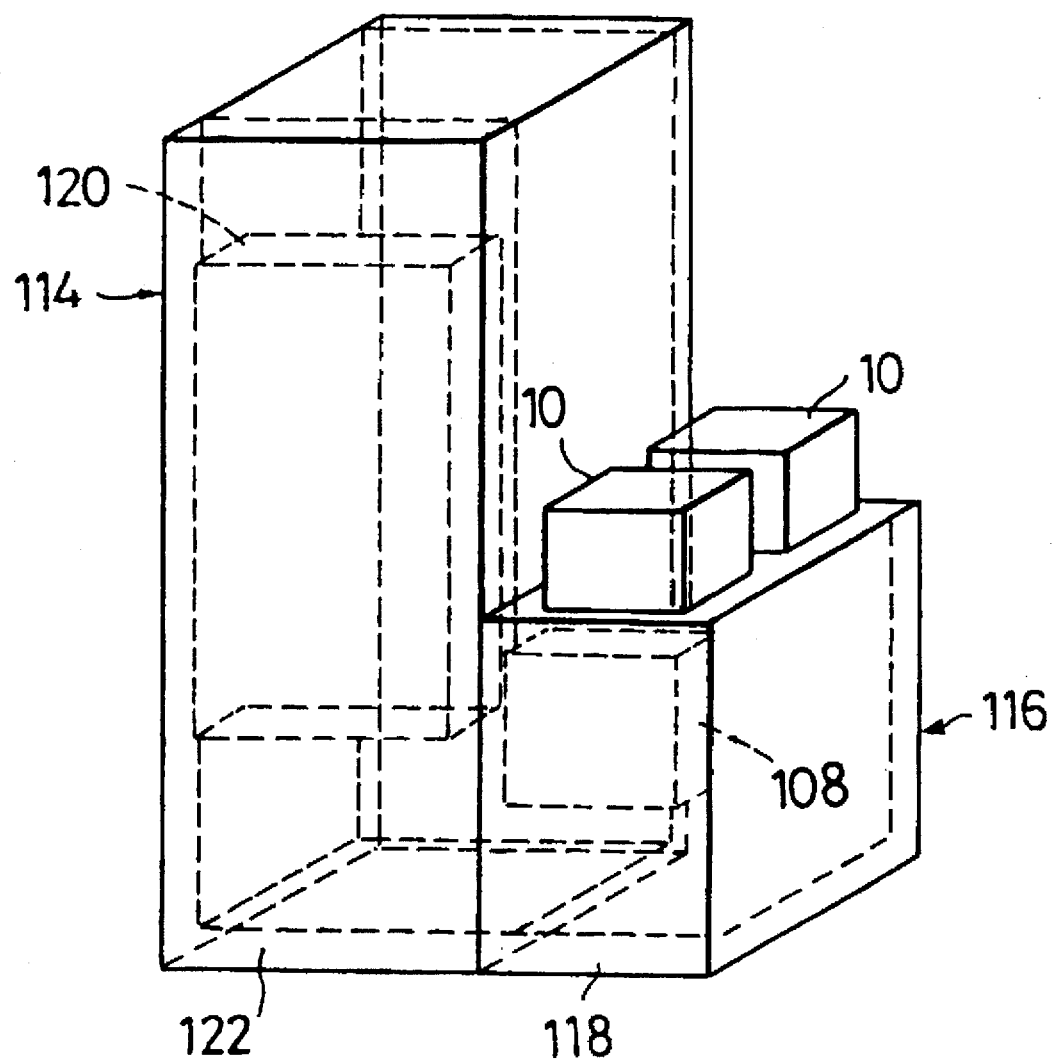
FIG. 5 is a perspective view showing a second embodiment of a clean transfer apparatus according to the present invention.
Figure 6:
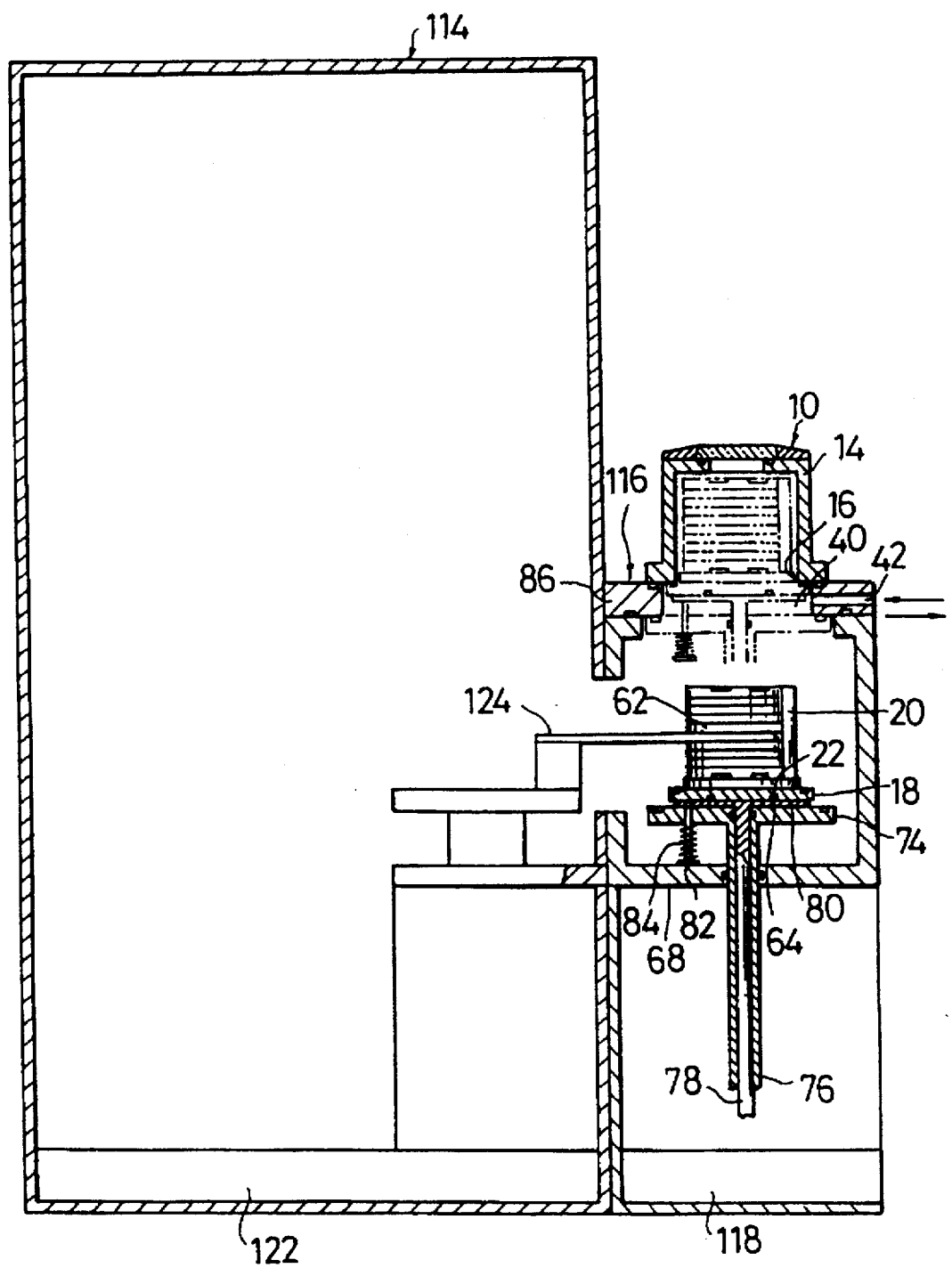
FIG. 6 is a sectional view of the clean transfer apparatus shown in FIG. 5.

Referring now to FIGS. 5 and 6, a second embodiment of a clean transfer apparatus according to the present invention is illustrated.

A clean transfer apparatus of the second embodiment generally includes a clean processing unit 114 such as an oxidation unit, a diffusion unit, a low-pressure CVD (LP-CVD) unit or the like and a loading unit 116 which is attached to the unit 114 and may have two vacuum clean boxes 10 connected thereto or integrated therewith.

The loading unit 116 may be constructed in substantially the same manner as the clean unit 66 described above with reference to FIGS. 1 to 4 and has a self-circulation type clean system incorporated therein for circulating gas in a manner to feed clean gas from which suspended dust has been removed by means of a fan filter 108 into a closed space and return it to the fan filter 108 by means of a clean circulation duct 118. Also, the loading unit 116 includes a carrier 80 for supporting a first shutter 18 of each of vacuum clean boxes 10, a second shutter 74 for operating a second opening of the unit 116, a mechanism for driving the carrier and second shutter, and a vacuum evacuation means for evacuating an intermediate area 40 which a first shutter 18 and the second shutter 74 face.

The clean processing unit 114 has a self-circulation type clean system incorporated therein which is formed therein with an internal space communicating with the loading unit 116 and sealedly kept clean and which is constructed so as to feed clean gas from which suspended dust has been removed into a closed space by means of a fan filter 120 and then return it to the fan filter 120 by means of a clean circulation duct 122, leading to circulation of the clean gas. Also, the clean processing unit 114 is provided therein with a robot arm 124 acting as a transfer means. The robot arm 124 carries out operation of transferring transferred objects or semiconductor wafers 62 from a holder 20 arranged on the first shutter 18 introduced into the loading unit 116 to the clean processing unit 114 and operation of returning the semiconductor wafers 62 to the holder 20.

Thus, in the second embodiment constructed as described above, attachment of the loading unit 116 to the clean processing unit 114 permits transfer of the transferred objects to be carried out by means of the vacuum clean box 10 even when the clean processing unit 114 is not adapted to permit the vacuum clean box 10 to be connected thereto.

Figure 7:
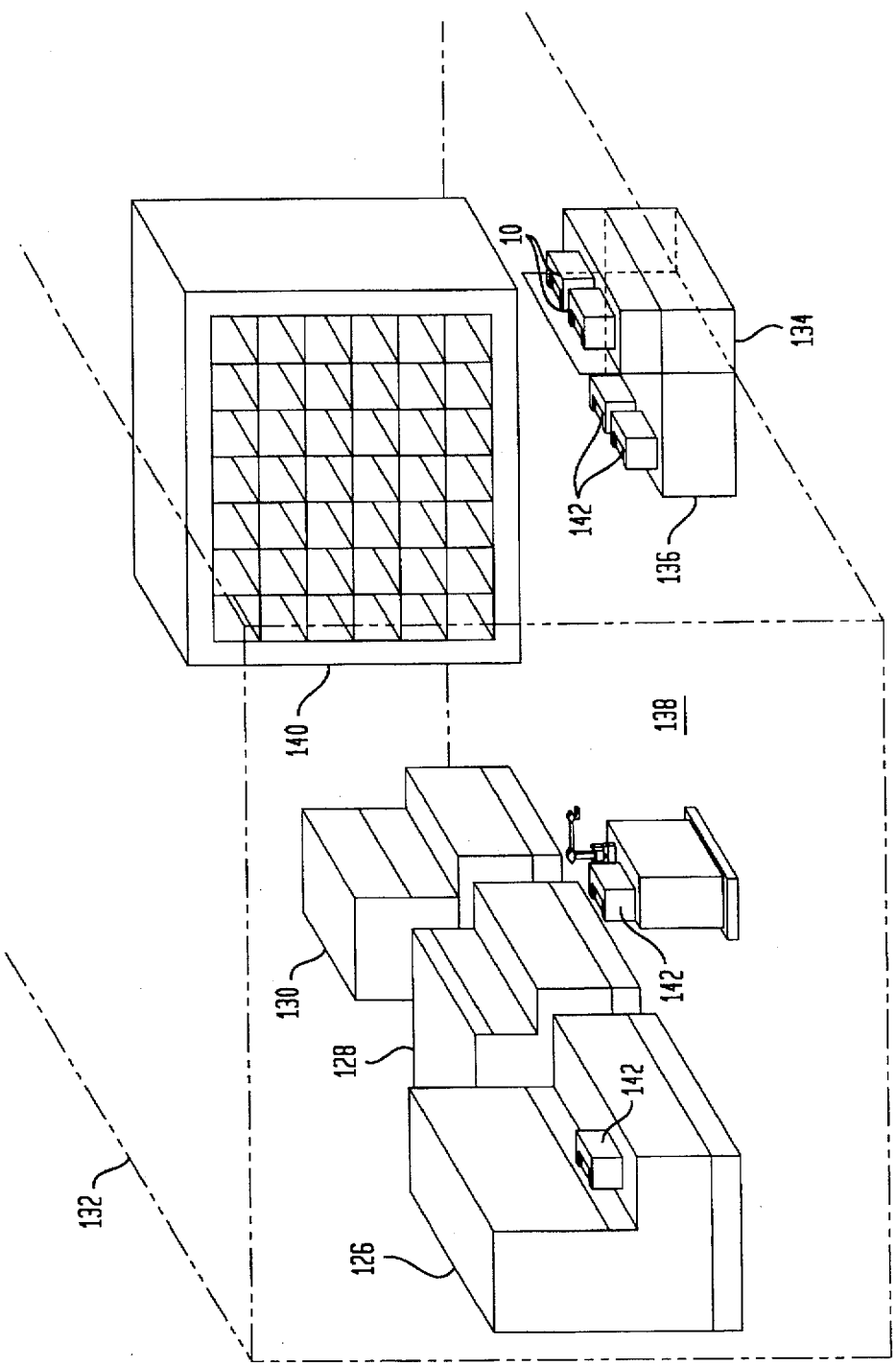
FIG. 7 is a perspective view showing a third embodiment of a clean transfer apparatus according to the present invention.
Figure 8A:
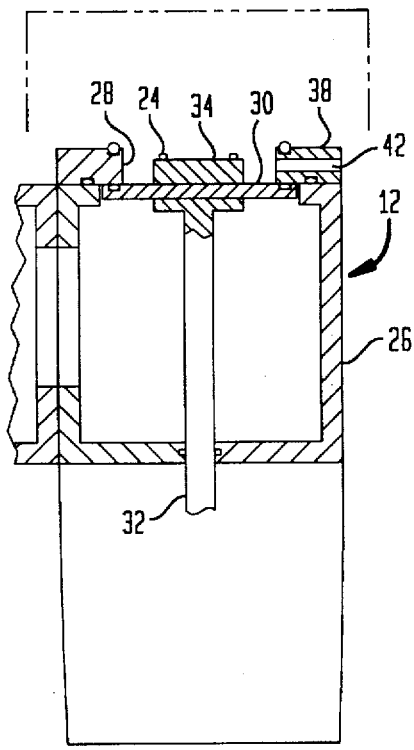
FIGS. 8A and 8B each are a schematic view showing a first half of operation of a conventional clean transfer apparatus.
Figure 8B:
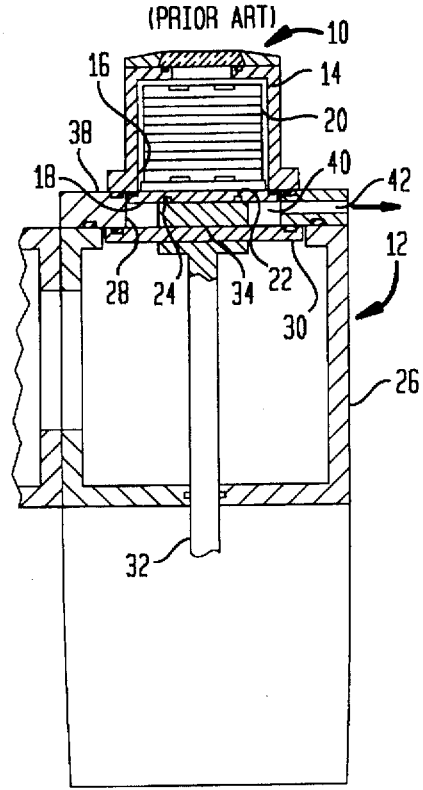
Figure 9A:
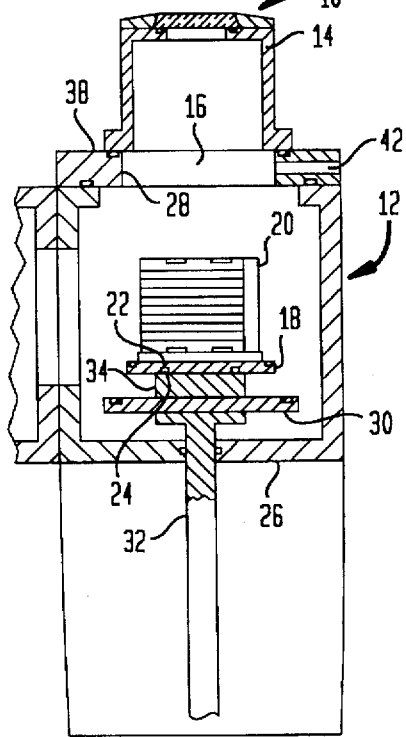
FIGS. 9A and 9B each are a schematic view showing a second half of operation of a conventional clean transfer apparatus.
Figure 9B:
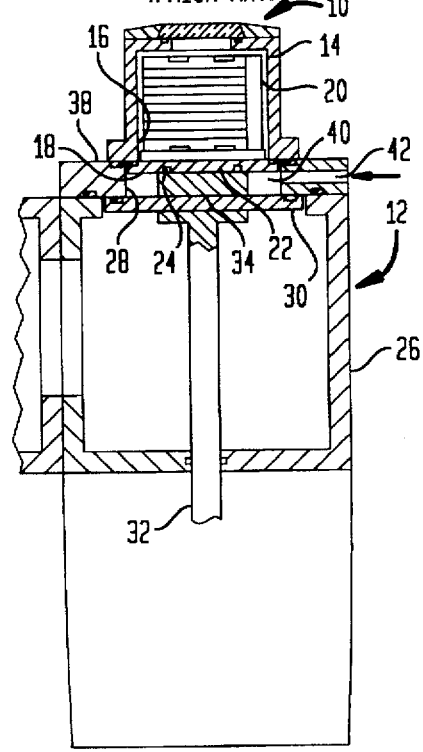

Referring now to FIG. 7, a third embodiment of a clean transfer apparatus according to the present invention is illustrated. A clean transfer apparatus of the third embodiment is adapted to transfer transferred objects or semiconductor wafers from a vacuum clean box 10 to inspection units 126, 128 and 130 arranged in a clean room 132. The clean transfer apparatus also includes a loading unit 134 arranged outside the clean room 132 in a manner to be contiguous to an outer side of a side wall of the clean room 132 and a clean unit 136 having a clean space defined therein and arranged inside the clean room 132 in a manner to be contiguous to the loading unit 134. The loading unit 134 may be constructed in substantially the same manner as the loading unit 116 of the second embodiment described above. Reference numeral 138 designates an unmanned carrier, 140 is a stocker for selecting semiconductor wafers after inspection, and 142 is magazines for storing the semiconductor wafers in the clean room, various clean units and the like.

In the third embodiment constructed as described above, the semiconductor wafers are introduced from the vacuum clean box 10 connected to the loading unit 134 into the loading unit 134 and then transferred to the clean unit 136 by means of a transfer means arranged therein, followed by transfer to the magazines 142 arranged on the clean unit 136. Then, the magazines 142 are selectively moved to the inspection units 126, 128 and 130 by means of the unmanned carrier 138, wherein the semiconductors in the magazines 142 are subjected to inspection and then selected depending on results of the inspection, followed by movement to the stocker 140 for classification by means of the unmanned carrier 138.

As can be seen from the foregoing, the present invention is constructed so as to carry out operation of the first shutter of the vacuum clean box and that of the unit to which the vacuum clean box is connected at different timings. Also, in the present invention, the vacuum clean box may be connected to a vacuum unit, as well as various processing units other than the vacuum unit for the purpose of transfer of the transferred objects thereto by means of vacuum clean box. Further, the vacuum clean box may be connected between clean rooms in order to transfer the transferred objects therebetween by means of the vacuum cleans box.

Also, the present invention facilitates positioning of the vacuum clean box for connection thereof to the clean unit, because the vacuum clean box is constructed in a simple manner while being free of any vacuum evacuation means and transfer means.

Further, the first shutter of the vacuum clean box is constructed so as to be introduced into the clean unit by means of the driving means of the clean unit while being kept engaged with the second shutter of the clean unit. Thus, loading of transferred objects such as parts required for processing or assembling products associated with a semiconductor, optical discs or the like on the first shutter permits transfer of the objects between the vacuum clean box and the clean unit to be facilitated.

In addition, the present invention minimizes the intermediate area which is formed due to connection between the vacuum clean box and the clean unit and of which vacuum evacuation is required. More specifically, it is not required to arrange a mechanism for driving the first and second shutters in the intermediate area. Thus, a length of time required for connection of the vacuum clean box to the clean unit or release of the former from the latter is significantly reduced.

Moreover, vacuum evacuation of the intermediate area permits dust around the second opening and on the second shutter to be concurrently discharged therefrom, so that the clean unit to which the vacuum clean box is connected may be placed in an industrial atmosphere.

Furthermore, when the vacuum clean box is left nonoperated for an increased period of time sufficient to deteriorate a degree of vacuum therein, a degree of vacuum in the intermediate area is deteriorated correspondingly to substantially eliminate a pressure difference therebetween, to thereby prevent scattering of dust due to the pressure difference occurring when the first shutter of the vacuum clean box is opened.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A clean transfer apparatus comprising:
   a vacuum clean box including a box body provided with a first opening and a first shutter acting also as a lid which airtightly closes said first opening;
   said vacuum clean box being constructed so as to provide airtightness sufficient to keep an interior thereof in a vacuum when said first opening is closed by said first shutter;
   said vacuum clean box being free of any vacuum evacuation means and transfer means; and
   a clean unit including a carrier detachably engaged with said first shutter, a second shutter and a driving means for driving said carrier and second shutter and provided with a second opening which is opened and closed by said second shutter;
   said carrier being free of any seal that is adapted for engaging said second opening;
   said vacuum clean box and clean unit cooperating with each other to form a closed space therebetween;
   said first shutter being rendered open by driving said carrier through said driving means while keeping said second opening closed by said second shutter.

2. A clean transfer apparatus as claimed in claim 1, including biasing means urging said second shutter toward said carrier.

3. A clean transfer apparatus as claimed in claim 1, wherein said first shutter of said vacuum clean box includes a first outer surface which is exposed to an ambient atmosphere outside said vacuum clean box when said first shutter closes said first opening of said vacuum clean box;
   said second shutter of said clean unit includes a second outer surface which is exposed to an ambient atmosphere outside said clean unit when said second shutter closes said second opening of said clean unit; and
   said closed space is defined by said first outer surface of said first shutter and said second outer surface of said second shutter when said vacuum clean box and clean unit are connected to each other.

4. A clean transfer apparatus as defined in claim 1, wherein said carrier is provided thereon with positioning pins detachably fitted in said first shutter.

5. A clean transfer apparatus as defined in claim 1, including a holder mounted on said first shutter for supporting transferred objects in a predetermined posture.

6. A clean transfer apparatus as defined in claim 1, wherein said clean unit includes a filter and a gas circulating means for circulating clean gas in said closed space.

7. A clean transfer apparatus comprising:
   a vacuum clean box including a box body provided with a first opening and a first shutter acting also as a lid which airtightly closes said first opening, said first shutter including a first outer surface which is exposed to an ambient atmosphere outside said vacuum clean box when said first shutter closes said first opening;
   said vacuum clean box being constructed so as to provide airtightness sufficient to keep an interior thereof in a vacuum when said first opening is closed by said first shutter;
   said vacuum clean box being free of any vacuum evacuation means and transfer means; and
   a clean unit including a carrier detachably engaged with said first shutter, a second shutter and a driving means for driving said carrier and said second shutter and provided with a second opening which is opened and closed by said second shutter, said second shutter including a second outer surface which is exposed to an ambient atmosphere outside said clean unit when said second shutter closes said second opening;
   said vacuum clean box and clean unit cooperating with each other to form a single continuous closed space therebetween defined by said first outer surface of said first shutter and said second outer surface of said second shutter when said vacuum clean box and clean unit are connected to each other;
   said first shutter being rendered open by driving said carrier through said driving means while keeping said second opening closed by said second shutter.

8. A clean transfer apparatus as defined in claim 7, including biasing means urging said second shutter toward said carrier.

9. A clean transfer apparatus as defined in claim 8, wherein said carrier is provided thereon with positioning pins detatchably fitted in said first shutter.

10. A clean transfer apparatus as defined in claim 8, including a holder mounted on said first shutter for supporting transferred objects in a predetermined posture.

11. A clean transfer apparatus as defined in claim 8, wherein said clean unit includes a filter and a gas recirculating means for recirculating clean gas in said closed space.

12. A clean transfer apparatus as defined in claim 7, wherein said carrier is provided thereon with positioning pins detachably fitted in said first shutter.

13. A clean transfer apparatus as defined in claim 12, including a holder mounted on said first shutter for supporting transferred objects in a predetermined posture.

14. A clean transfer apparatus as defined in claim 12, wherein said clean unit includes a filter and a gas recirculating means for recirculating clean gas in said closed space.

15. A clean transfer apparatus as defined in claim 7, including a holder mounted on said first shutter for supporting transferred objects in a predetermined posture.

16. A clean transfer apparatus as defined in claim 7, wherein said clean unit includes a filter and a gas recirculating means for recirculating clean gas in said closed space.

\* \* \* \* \*

UNITED STATES PATENT AND TRADEMARK OFFICE
CERTIFICATE OF CORRECTION

PATENT NO. : 5,730,573

DATED : March 24, 1998

INVENTOR(S) : Masujima et al.

It is certified that error appears in the above-identified patent and that said Letters Patent is hereby corrected as shown below:

Column 12, line 37, "dean" should read --clean--.

Column 12, line 53, "dean" should read --clean--.

Signed and Sealed this

Thirtieth Day of June, 1998

*Attest:*

BRUCE LEHMAN

*Attesting Officer*  Commissioner of Patents and Trademarks